US009225372B2

(12) United States Patent
Butler

(10) Patent No.: US 9,225,372 B2
(45) Date of Patent: *Dec. 29, 2015

(54) NEAR FIELD COMMUNICATIONS (NFC) DEVICE POWER HARVESTING AND POWER SUPPLY SELECTION

(71) Applicant: Broadcom Europe Limited, Cambridge (GB)

(72) Inventor: Paul Butler, Cambridge (GB)

(73) Assignee: Broadcom Europe Limited, Cambridge (GB)

( * ) Notice: Subject to any disclaimer, the term of this patent is extended or adjusted under 35 U.S.C. 154(b) by 0 days.

This patent is subject to a terminal disclaimer.

(21) Appl. No.: 14/592,258

(22) Filed: Jan. 8, 2015

(65) Prior Publication Data

US 2015/0118965 A1    Apr. 30, 2015

Related U.S. Application Data

(63) Continuation of application No. 14/043,454, filed on Oct. 1, 2013, now Pat. No. 8,971,804, which is a continuation of application No. 12/863,617, filed as application No. PCT/GB2009/050058 on Jan. 23, 2009, now Pat. No. 8,559,872.

(30) Foreign Application Priority Data

Jan. 23, 2008 (GB) .................................... 0801225.4
Jun. 27, 2008 (GB) .................................... 0811794.7
Sep. 9, 2008 (GB) ..................................... 086474.1

(51) Int. Cl.
*H04B 5/00*        (2006.01)
*H04B 1/16*        (2006.01)
(Continued)

(52) U.S. Cl.
CPC .......... *H04B 1/1607* (2013.01); *G06K 19/0701* (2013.01); *G06K 19/0723* (2013.01);
(Continued)

(58) Field of Classification Search
CPC ....................................................... H04B 5/0037
USPC ................ 455/41.1, 41.2, 127.1, 127.5, 129, 455/343.1, 571–574
See application file for complete search history.

(56) References Cited

U.S. PATENT DOCUMENTS 4,406,929 A    9/1983  Pace et al.
6,134,130 A   10/2000  Connell et al.
(Continued)

FOREIGN PATENT DOCUMENTS

EP    1231557 A2    8/2002
EP    1280099 A1    1/2003
(Continued)

OTHER PUBLICATIONS

Saeid Hashemi, et al. "A novel fully-integrated dropless coltage CMOS rectifier for wirelessly powered devices" MICROELECTRONICS, (2007), ICM 2007, International Conference ON, IEEE, Piscataway, NJ, USA, Dec. 29, 2007, pp. 333-336.
(Continued)

*Primary Examiner* — Tuan H Nguyen
(74) *Attorney, Agent, or Firm* — Sterne, Kessler, Goldstein & Fox P.L.L.C.

(57) ABSTRACT

A near field RF communicator has an antenna circuit to couple with the H field of an RF magnetic field and a power supply deriver to derive a rectified auxiliary power supply from the received magnetic field. Rectification may be performed using an actively switched rectifier having a passive mode of operation. A sub regulation system is provided to regulate the auxiliary power supply to inhibit the possibility of temporally varying power requirements of the near field RF communicator or its host causing an apparent load modulation of a signal that is transmitted or received by the communicator.

20 Claims, 6 Drawing Sheets

(51) Int. Cl.
    *G06K 19/07*  (2006.01)
    *G11C 5/14*  (2006.01)
(52) U.S. Cl.
    CPC .............. *G11C5/142* (2013.01); *H04B 5/0018* (2013.01); *H04B 5/0031* (2013.01); *H04B 5/0037* (2013.01); *H04B 5/0081* (2013.01)

(56) References Cited

U.S. PATENT DOCUMENTS

| | | | |
|---|---|---|---|
| 6,995,996 B2 | 2/2006 | Youm | |
| 7,505,794 B2 * | 3/2009 | Watanabe et al. | 455/572 |
| 7,611,066 B2 | 11/2009 | Shyu | |
| 7,912,441 B2 * | 3/2011 | Von Bosch | 455/343.1 |
| 8,326,224 B2 | 12/2012 | Butler | |
| 8,559,872 B2 | 10/2013 | Butler | |
| 8,971,804 B2 | 3/2015 | Butler | |
| 2002/0118557 A1 | 8/2002 | Ohlsson | |
| 2003/0011780 A1 | 1/2003 | Dalhoff | |
| 2003/0017804 A1 | 1/2003 | Heinrich et al. | |
| 2006/0128345 A1 | 6/2006 | Ootaka et al. | |
| 2007/0155442 A1 | 7/2007 | Watanabe et al. | |
| 2007/0249398 A1 | 10/2007 | Watanabe et al. | |
| 2008/0259665 A1 | 10/2008 | Brederlow et al. | |

FOREIGN PATENT DOCUMENTS

| | | |
|---|---|---|
| EP | 1852804 A9 | 8/2008 |
| WO | WO 2005124987 A1 | 12/2005 |
| WO | WO 2006130197 A2 | 12/2006 |
| WO | WO 2008117029 A2 | 10/2008 |

OTHER PUBLICATIONS

Yat-Lei Lam et al. "Integrated Low-Loss CMOS Active Rectifier for Wirelessly Powered Devices" IEEE Transactions On Circuits and Systems II: Express Briefs, IEEE Service Center, New York, NY, US, vol. 53, No. 12, Dec. 1, 2006, pp. 1378-1382.

* cited by examiner

NEAR FIELD COMMUNICATIONS (NFC) DEVICE POWER HARVESTING AND POWER SUPPLY SELECTION

CROSS-REFERENCE TO RELATED APPLICATIONS

The present application is a continuation of U.S. patent application No. 14/043,454, filed Oct. 1, 2013, which is a continuation of U.S. patent application Ser. No. 12/863,617, filed Jan. 23, 2009, now U.S. Pat. No. 8,559,872, which is a National Stage of International Application No. PCT/GB09/50058, filed on Jan. 23, 2009, which claims the benefit of Great Britain Patent Application No. 0801225.4, filed on Jan. 23, 2008, Great Britain Patent Application No. 0811794.7, filed on Jun. 27, 2008, and Great Britain Patent Application No. 0816474.1, filed on Sep. 9, 2008, each of which is incorporated herein by reference in its entirety.

BACKGROUND

1. Field of Disclosure

This invention relates to near field RF communicators and near field communications enabled devices.

2. Related Art

Near field RF (radio frequency) communication is becoming more and more commonplace as is the use of such technology to transfer data. Near field RF communicators communicate through the modulation of the magnetic field (H field) generated by a radio frequency antenna. Near field RF communication thus requires an antenna of one near field RF communicator to be present within the alternating magnetic field (H field) generated by the antenna of another near field RF communicator by transmission of an RE signal (for example a 13.56 Mega Hertz signal) to enable the magnetic field (H field) of the RE signal to be inductively coupled between the communicators. The RF signal may be modulated to enable communication of control and/or other data. Ranges of up to several centimeters (generally a maximum of 1 meter) are common for near field RF communicators.

NFC communicators are a type of near field RF communicator that is capable in an initiator mode of initiating a near field RF communication (through transmission or generation of an alternating magnetic field) with another near field RF communicator and is capable in a target mode of responding to initiation of a near field RF communication by another near field RF communicator. The term "near field RF communicator" includes not only NFC communicators but also initiator near field RF communicators such as RFID transceivers or readers that are capable of initiating a near field RF communication but not responding to initiation of a near field RF communication by another near field RF communicator and target or responding near field RF communicators such as RFID transponders or tags that are capable of responding to initiation of a near field RF communication by another near field RF communicator but not of initiating a near field RF communication with another near field RF communicator. Hence NFC communicators can act as both RFID transceivers and RF ID transponders and are able to communicate with other NFC communicators, RFID transceivers and RFID transponders.

In addition NFC communicators may be associated with or comprised within or attached to certain peripheral devices, for example SIM cards (e.g. UICC), Secure Elements, memory devices (for example MCU, RAM, ROM and non-volatile memory), display driver or other drivers. During operation the NFC communicator must also be able to communicate with and transfer data to and from such peripheral device.

There are several standards in existence which set out certain communication protocols and functional requirements for RFID and near field RF communications. Examples are ISO/IEC 14443, ISO 15693, ISO/IEC 18092 and ISO/IEC 21481.

NFC communicators may be comprised within a larger device, NFC communications enabled devices. Examples include mobile telephones, PDAs, computers, smart cards. When comprised within such NFC communications enabled devices the NFC communicator must be able to transfer data to and from the larger device and to and from any peripheral devices (including interface systems, such as the single wire protocol) associated with such larger device.

NFC communicators and NFC communications enabled devices will usually have a power supply, for example a battery or fuel cell. Where the NFC communicator forms part of an NFC communications enabled device the power supply may be derived from the host or larger device, for example the mobile phone battery. Likewise power may be derived from a power supply provided by an attached or linked peripheral device (including interface systems such as the single wire protocol). This power supply is referred to as the primary or main power supply below. Due to the variety of uses to which NFC communicators may be put there is a need for such NFC communicators to be able to operate when the primary power supply is too low to provide sufficient power for the NFC communicator or is not present. For example the battery in a mobile phone may have been removed for charging, in which case the battery supply will not be available to an NFC communicator comprised within the mobile phone. An example of where the NFC communicator may require a power supply may be where the NFC communicator is designed to act as a transport ticket. A person will need to be able to use the transport ticket even when the battery in the mobile phone is low or depleted and thus the NFC communicator needs an alternative power source. In addition and unlike a passive transponder (which requires a derived power supply to operate) the NFC communicator needs to derive sufficient power to additionally power any peripheral device or host device or parts of such devices required for operation of the NFC communicator. For example where the NFC communicator is transferring secure data relating to payment to another NFC communicator (for example where such secure data is held on a secure element), it will require sufficient power not only to transfer the data but to power the secure element and to communicate with the secure element.

The provision of alternative power supplies (for example an additional battery) is expensive and can take up significant real estate within the NFC communicator or NFC communications enabled device. The alternative is a system which derives sufficient power from a received field to power the NEC communicator and any other functions within the NFC communications enabled device or peripheral device which must be powered for the NFC communicator to operate and communicate the required data. However in the latter case the level of received field cannot be guaranteed, nor can the time which the NFC communicator will be in that received field and able to derive power.

BRIEF SUMMARY OF THE INVENTION

An aspect of the present invention provides a near field RF communicator that alleviates at least some of the aforementioned problems.

An aspect of the present invention provides a near field RF communicator comprising at least one rectifier operable to provide a rectified voltage from an RF field received by the near field RF communicator; a shunt regulator connected to the antenna circuit; a first power supply; a controller; and a second power supply comprising at least one rectifier, at least one sensor, sub-regulation functionality and capacitance and operable to derive a power supply from a received RF field; wherein first and second power supplies are not operable at the same time and wherein operation of the second power supply is controlled by the controller in accordance with the level of RE field received by the near field RF communicator. The first power supply comprises the primary power supply as described above.

The second power supply (referred to as the FPSU below) is derived from the received RF field and preferably only operates once the primary power supply is inadequate and the received RE field exceeds a certain pre-determined threshold.

In a further aspect operation of the second power supply is controlled through use of a switch, under control of the near field RF communicator controller. In a preferred embodiment the switch is a bulk switching device, for example a PMOS device.

In a further aspect of the invention the second power supply is used to provide power to at least one of the near field RF communicator, a host device or a peripheral device or a peripheral interface or an external device.

In one aspect the present invention provides a near field RF communicator comprising near field communication functionality; an antenna circuit; at least one rectifier operable to provide a rectified voltage from an RF field received by the near field RF communicator; a shunt regulator connected to the antenna circuit; a first power supply; a controller; and a second power supply comprising at least one rectifier, at least one sensor, sub-regulation functionality and capacitance and operable to derive a power supply from a received RF field; wherein first and second power supplies are not operable at the same time and wherein operation of the second power supply is controlled by the controller in accordance with the level of RF field received by the near field RF communicator.

In an embodiment there is provided a near field RF communicator wherein operation of the second power supply only occurs where received current exceeds a pre-determined threshold.

In an embodiment there is provided a near field RF communicator comprising a switch wherein such switch controls output from the at least one rectifier comprised within the second power supply.

In an embodiment there is provided a near field RF communicator comprising a switch wherein operation of such switch is controlled by the controller.

In an embodiment there is provided a near field RF communicator wherein output from the rectifier within the second power supply is supplied to a first capacitor.

In an embodiment there is provided a near field RF communicator wherein the output from first capacitor is used to provide power to at least one of the near field RF communicator, a host device or a peripheral device or a peripheral interface or an external device In an embodiment there is provided a near field RF communicator wherein the output from the first capacitor is sub-regulated and stored in a second capacitor.

In an embodiment there is provided a near field RF communicator wherein the output from second capacitor is used to provide power to at least one of the near field RF communicator, a host device or a peripheral device or a peripheral interface or an external device In an embodiment there is provided a near field RF communicator wherein the near field RF communicator is an NFC communicator.

In an embodiment there is provided a near field RF communications enabled device comprising a near field RF communicator.

In an embodiment there is provided a peripheral device comprising a near field RF communicator.

In an embodiment there is provided a peripheral device coupled with a near field RF communicator.

In an embodiment there is provided a near field RF communication enabled peripheral device in wherein the peripheral device is at least one of a secure element, smart card, SIM card, display device, interface system.

In an embodiment there is provided a near field RF communication enabled peripheral device comprising a mobile telephone, an IPOD, or a PDA.

In an embodiment there is provided a near field RF communicator wherein the at least one rectifier within the second power supply comprises an active rectifier circuit.

In an embodiment there is provided a near field RF communicator wherein the rectifier within the second power supply comprises a rectifier in accordance with FIG. 4.

In an embodiment there is provided a near field RF communicator wherein the sub-regulation functionality comprises a class A/B output stage amplifier.

In an embodiment there is provided a near field RF communicator wherein the sub-regulation functionality comprises at least one sub-regulator in accordance with FIG. 6.

In an aspect of the present invention there is provided a near field RF communicator having an inductive coupler to couple inductively to the magnetic field of a received RF signal to provide an induced voltage and a power supply deriver coupled to the inductive coupler, the power supply deriver comprising: at least one rectifier to provide a rectified supply using the induced voltage; and, at least one supply regulator to regulate the rectified supply to inhibit the possibility of variability in a load coupled to the power supply deriver inadvertently causing load modulation of the received RF signal.

In an embodiment there is provided a near field RF communicator wherein at least one supply regulator is arranged to provide the power supply deriver with a substantially constant input impedance.

In an embodiment there is provided a near field RF communicator wherein the at least one supply regulator is arranged to regulate current.

In an embodiment there is provided a near field RF communicator comprising a power provider and a controller to control operation of the power supply deriver in accordance with the operation of the power provider.

In an embodiment there is provided a near field RF communicator comprising a power provider wherein the power supply deriver further comprises: a sensor to sense an output of the power provider; and, a controller to control operation of the power supply deriver in accordance with the sensed output.

In an embodiment there is provided a near field RF communicator wherein the controller is configured to inhibit or prevent operation of the power supply deriver in the event that the power provider can provide a sufficient power supply.

In an embodiment there is provided a near field RF communicator wherein the controller is configured to inhibit or prevent operation of power provider in the event that the output sensed by the sensor indicates that the power provider cannot provide a sufficient power supply.

In an embodiment there is provided a near field RF communicator wherein the controller is configured to ensure that that the power deriver and the power provider cannot be coupled together.

In an embodiment there is provided a near field RF communicator wherein the controller is configured to switch on the power deriver only in the event that the power provider cannot provide a sufficient power.

In an embodiment there is provided a near field RF communicator wherein the sensor is configured to sense whether received power is sufficient power according to first and second thresholds and to provide a control signal when received power exceeds the first threshold and to switch the FPSU off when power falls below a second threshold.

In an embodiment there is provided a near field RF communicator wherein the controller comprises a switching mechanism to control at least one of bulk or back gate switching of at least one MOS transistor.

In an embodiment there is provided a near field RF communicator wherein the sensor is configured to sense a voltage induced by coupling of the inductive coupler to a magnetic field.

In an embodiment there is provided a near field RF communicator comprising a voltage regulator to regulate a voltage induced by coupling of the inductive coupler to a magnetic field.

In an embodiment there is provided a near field RF communicator comprising a voltage regulator to regulate a voltage induced by coupling of the inductive coupler to a magnetic field, wherein the sensor is configured to sense an induced voltage by measuring a current of an output of the voltage regulator.

In an embodiment there is provided a near field RF communicator wherein the controller is configured to switch on the power deriver in the event that a sufficient voltage is induced by the inductive coupling.

In an embodiment there is provided a near field RF communicator wherein the at least one supply regulator comprises a shunt regulator and a series low drop out regulator.

In an embodiment there is provided a near field RF communicator wherein the at least one supply regulator has a class AB amplifier stage configuration.

In an embodiment there is provided a near field RF communicator wherein control of the series low drop out regulator is modified by a bulk, back gate, switch coupling.

In an embodiment there is provided a near field RF communicator further comprising at least one charge store coupled to at least one of the rectifier and the at least one supply regulator.

In an embodiment there is provided a near field RF communicator further comprising a first charge store coupled to the rectifier and a second charge store coupled the at least one supply regulator.

In an embodiment there is provided a near field RF communicator wherein the at least one rectifier comprises an active rectifier circuit.

In an embodiment there is provided a near field RF communicator comprising an antenna circuit, a controller, and first and second power supplies, wherein the first power supply comprises: at least one rectifier to supply a rectified voltage derived from an RF field received by the antenna circuit; and, a capacitance to store the rectified voltage; and at least one sub-regulator to regulate the rectified voltage, wherein the controller is configured to control operation of the second power supply in accordance with the level of RF field received by the near field RF communicator and to inhibit operation of the first and second power supplies at the same time.

In an embodiment there is provided a near field RF communicator wherein the at least one rectifier comprises at least one active rectifying element coupled to receive at least one control signal and coupling each rectifier input to the rectifier output.

In an embodiment there is provided a near field RF communicator comprising a comparator coupled to provide a control signal to at least one of the active rectifying elements.

In an embodiment there is provided a near field RF communicator wherein the at least one rectifier comprises first to fourth arms each containing a respective one of first to fourth active elements each having first and second electrodes and a control electrode to control a conduction path between the first and second electrodes, the first electrodes of the first and second active elements being coupled to a ground coupling, the second electrodes of the first and second active elements being coupled to first and second inputs, respectively, the control electrodes of the first and second active elements being coupled to the second and first inputs respectively, the second electrodes of the second and fourth active elements and of the first and third active elements being coupled together, the first electrodes of the third and fourth active elements being coupled to an output of the at least one rectifier, and the control electrodes of the third and fourth active elements being coupled to respective outputs of a comparator that is coupled to the first and second inputs.

In an embodiment there is provided a near field RF communicator wherein each of the third and fourth one active elements comprises a diode in parallel with the conduction path.

In an embodiment there is provided a near field RF communicator wherein the comparator comprises for each input a current mirror comparator configured to provide an output voltage determined by a difference between a current resulting from a voltage at the input and a current resulting from a reference voltage.

In an embodiment there is provided a near field RF communicator substantially as herein described with reference to the accompanying drawings.

In an embodiment there is provided a near field RF communicator wherein the near field RF communicator comprises a CMOS device.

In an embodiment there is provided a near field RF communicator wherein the near field RF communicator is an NFC communicator.

In an embodiment there is provided a near field RF communicator comprising a near field RF communicator in accordance with any preceding claim.

In an embodiment of the present invention there is provided a peripheral device comprising a near field RF communicator in accordance with any of the herein described embodiments or aspects of the invention.

In an embodiment of the present invention there is provided a peripheral device coupled with a near field RF communicator in accordance with any of the herein described embodiments or aspects of the invention. The peripheral device may be at least one of a secure element, smart card, SIM card, display device, and an interface system.

In an embodiment, a near field RF communicator has an antenna circuit to couple with the H field of an RF magnetic field and a power supply deriver to derive a rectified auxiliary power supply from the received magnetic field. Rectification may be performed using an actively switched rectifier having a passive mode of operation. A sub regulation system is provided to regulate the auxiliary power supply to inhibit the possibility of temporally varying power requirements of the near field RF communicator or its host causing an apparent load modulation of a signal that is transmitted or received by the communicator.

BRIEF DESCRIPTION OF THE DRAWINGS/FIGURES

Embodiments of the present invention will now be described, by way of example, with reference to the accompanying drawings, in which.

DETAILED DESCRIPTION OF THE DISCLOSURE

With reference to the drawings in general, it should be understood that any functional block diagrams are intended simply to show the functionality that exists within the device and should not be taken to imply that each block shown in the functional block diagram is necessarily a discrete or separate entity. The functionality provided by a block may be discrete or may be dispersed throughout the device or throughout a part of the device. In addition, the functionality may incorporate, where appropriate, hard-wired elements, software elements or firmware elements or any combination of these. The near field RF communicator may be provided wholly or partially as an integrated circuit or collection(s) of integrated circuits.

Figure 1:
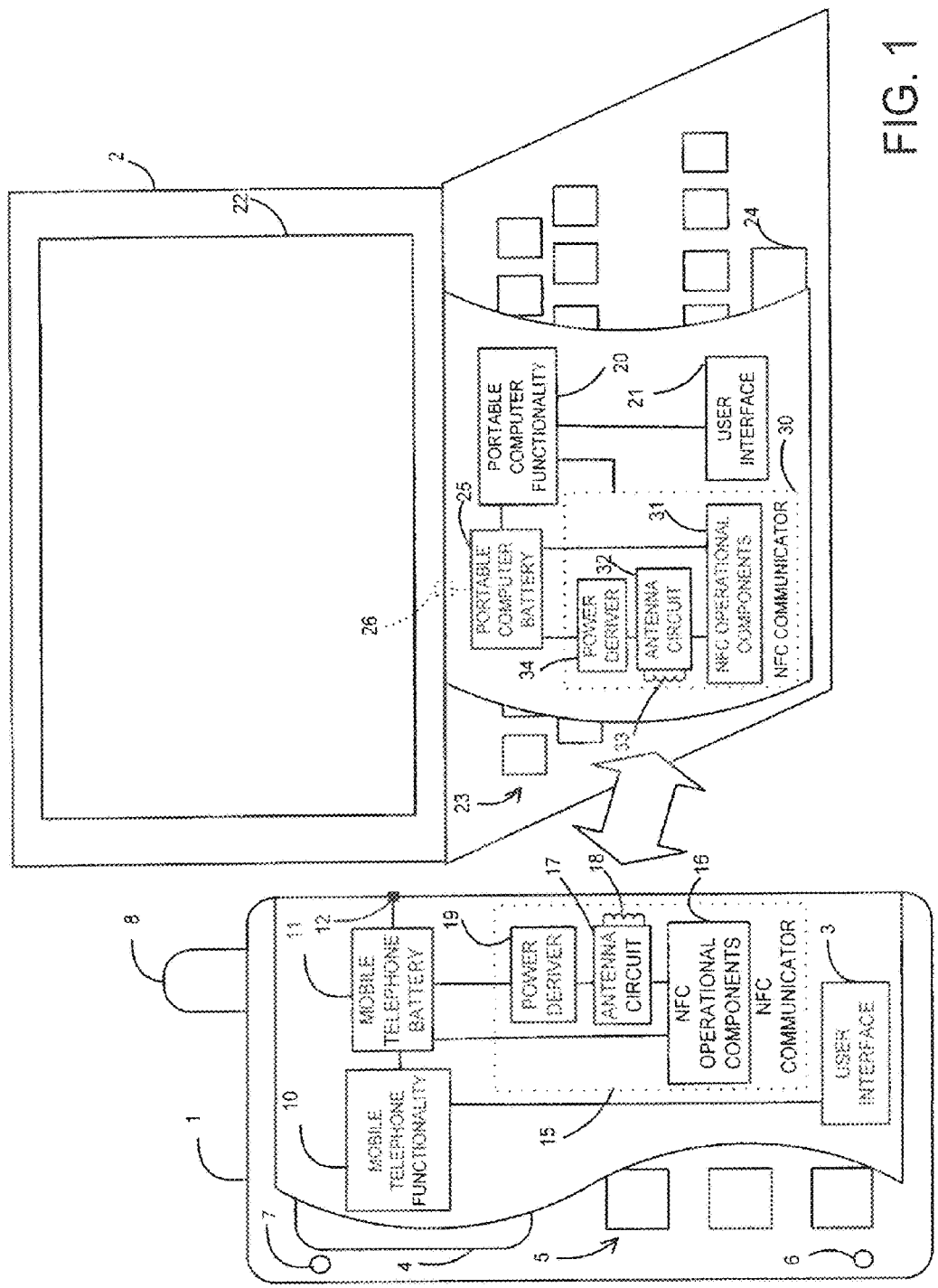
FIG. 1 shows a representational diagram illustrating communication between two devices comprising NFC communicators.

Referring now specifically to FIG. 1, there is shown a representational diagram illustrating communication between two NFC communications enabled devices. In FIG. 1 the representations of the NFC communications enabled devices have been shown partly cut-away and the functionality provided by the NFC communications enabled devices illustrated by way of a functional block diagram within the NFC communications enabled device.

As shown in FIG. 1, one NEC communications enabled device comprises a mobile telephone (cellphone) 1 and the other NFC communications enabled device comprises a portable computer 2 such as a notebook or laptop computer.

The mobile telephone 1 has the usual features of a mobile telephone including mobile telephone functionality 10 (in the form of, usually, a programmed controller, generally a processor or microprocessor with associated memory or data storage, for controlling operation of the mobile telephone in combination with a SIM card), an antenna 8 for enabling connection to a mobile telecommunications network, and a user interface 3 with a display 4, a keypad 5, a microphone 6 for receiving user voice input and a loudspeaker 7 for outputting received audio to the user. The mobile telephone also has a chargeable battery 11 coupled to a charging socket 12 via which a mains adapter (not shown) may be connected to enable charging of the battery 11. The mobile telephone 1 may have an alternative or additional power supply (not shown), for example a reserve battery or emergency battery. The chargeable battery 11 forms the primary power supply for the mobile telephone and NFC communicator 15. Given it is chargeable, it is designed to be removed at certain times.

Similarly the portable computer 2 has the usual features of a portable computer including portable computer functionality 20 in the form of, usually, a processor with associated memory in the form of ROM, RAM and/or hard disk drive, one or more removable media drives such as a floppy disk drive and/or a CDROM or DVD drive, and possibly a communications device for enabling the portable computer to connect to a network such as the Internet. The portable computer 2 also includes a user interface 21 including a display 22, a keyboard 23 and a pointing device, as shown a touchpad 24. The portable computer 2 also has a chargeable battery 25 coupled to a charging socket 26 via which a mains adapter (not shown) may be connected to enable charging of the battery 25. Again the chargeable battery 25 is the primary power supply for the portable computer and NFC communicator 30.

In addition, as shown in FIG. 1, both NFC communications enabled devices 1 and 2 have an NFC communicator 15 and 30. As shown, the NFC communicators 15 and 30 are incorporated within the larger devices and, as with the other functional blocks, may be discrete entities within the host devices or may be provided by features dispersed throughout or integrated within the host device or a part of the host device.

Each NFC communicator 15 and 30 comprises NFC operational components 16 and 31 for, as will be described below, enabling control of the NFC functionality and generation, modulation and demodulation of an RF signal. Each NFC communicator 15 and 30 also comprises an antenna circuit 17 and 32 comprising an inductor or coil in the form of an antenna 18 and 33. The antenna circuits 17 and 32 enable an alternating magnetic field (H field) generated by the antenna of one near field RF communicator 15 (or 30) by transmission of an RF signal (for example a 13.56 Mega Hertz signal) to be inductively coupled to the antenna of the other near field RF communicator 30 (or 15) when that antenna is within the near field of the RF signal generated by the one near field RF communicator 15 (or 30).

The NFC communicators 15 and 30 are coupled to the mobile telephone and portable computer functionality 10 and 20, respectively, to enable data and/or control commands to be sent between the NFC communicator and the host device and to enable user input to the NFC communicator. Communication between the user interface 3 or 21 and the NFC communicator 15 or 30 is via the host device functionality 11 or 20, respectively.

Each NFC communicator 15 and 30 also comprises a power provider 19 and 34. The power providers 19 and 34 may be power supplies within the host device or specific to the NFC communicators 15 and 30, for example a button cell battery, or other small battery. In this case as shown by dashed lines in FIG. 1, one or both of the power providers 19 and 34 comprise a coupling to derive power from the corresponding device battery 11 or 25 i.e. the primary power supply.

It will be appreciated that FIG. 1 shows only examples of types of host devices. A host device may be another type of electrical device such as a personal digital assistant (PDA), other portable electrical device such as a portable audio and/or video player such as an MP3 player, an IPOD.®., CD player, DVD player or other electrical device. As another possibility the NFC communicator (15 or 3) may be comprised within or coupled to a peripheral device, for example in the form of a smart card or other secure element which may be stand alone or comprised within or intended to be inserted into another electrical device. For example a SIM card for use in a mobile telephone. As a further possibility such peripheral devices may comprise interfacing systems or protocols such as the single wire protocol.

Also, rather than being incorporated within the host device, the NFC communicator 15 or 30 may be associated with the host device, for example by a wired or wireless coupling. In such a case, a housing of the NFC communicator may be physically separate from or may be attached to the housing of the host device; in the later case, the attachment may be permanent once made or the NFC communicator may be removable. For example, the NFC communicator may be housed within: a housing attachable to another device; a housing portion, such as a fascia of the NFC communications enabled device or another device; an access card; or may have a housing shaped or configured to look like a smart card. For example an NFC communicator may be coupled to a larger device by way of a communications link such as, for example, a USB link, or may be provided as a card (for example a PCMCIA card or a card that looks like a smart card) which can be received in an appropriate slot of the larger or host device.

In addition, one or both of the NFC communications enabled devices may be a standalone NFC communicator, that is it may have no functionality beyond its NFC communications functionality.

Figure 2:
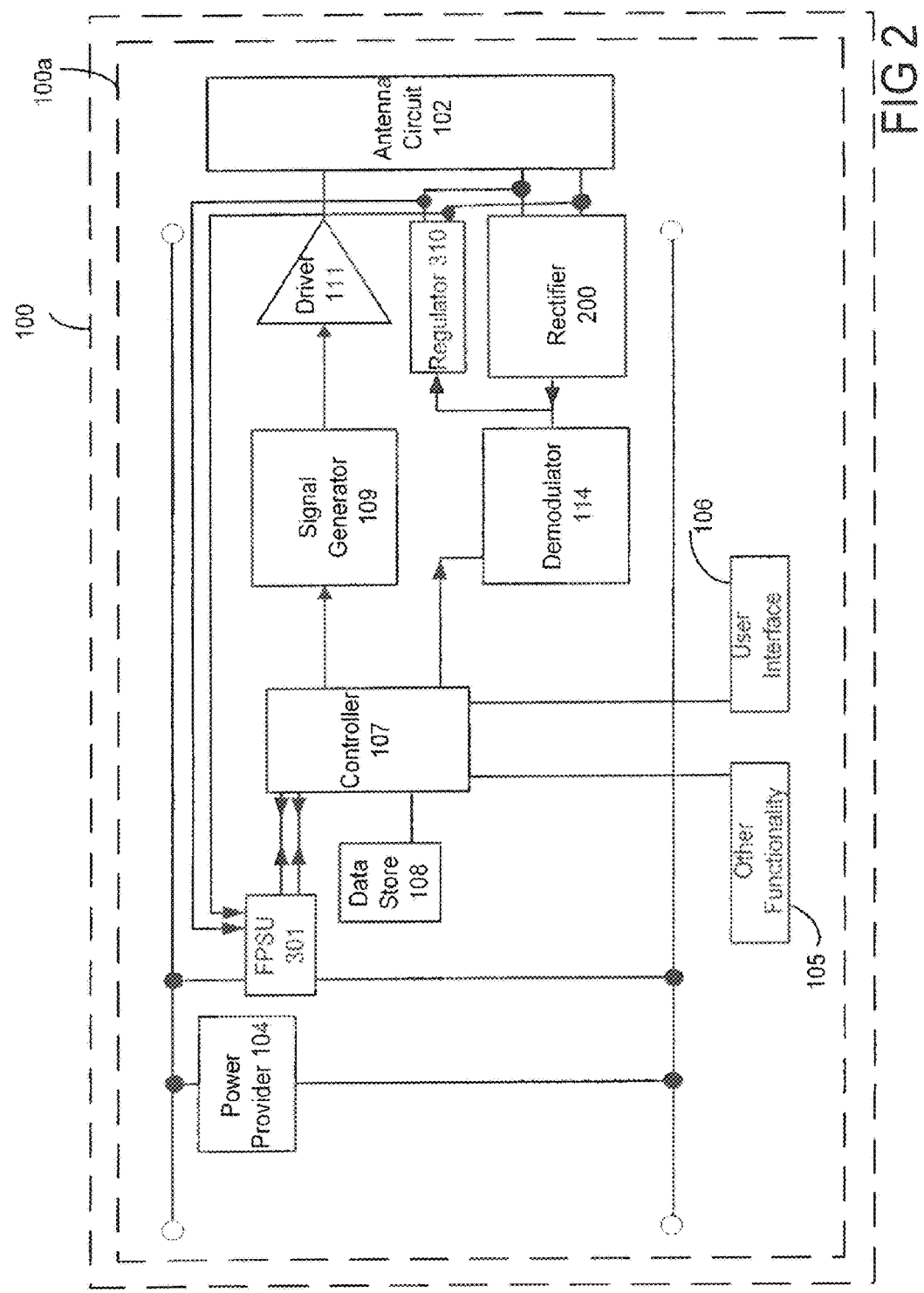
FIG. 2 shows an embodiment of an NFC communicator according to an aspect of the present invention.

FIG. 2 shows a functional block diagram of an NFC communications enabled device 100 in accordance with the invention to illustrate in greater detail one way in which the NFC operational components of an NFC communications enabled device embodying the invention may be implemented.

In this example, the NFC communications enabled device 100 comprises an NFC communicator 100*a* having NFC operational components including an antenna circuit 102, power provider 104, controller 107, data store 108, signal generator 109 and demodulator 114.

The power provider 104 may be any one or more of the types of power providers discussed above. In the interests of simplicity, power supply couplings from the power provider 104 to other components are not shown in FIG. 2.

The NFC communications enabled device 100 may or may not also have or be capable of being connected or coupled with at least one of other functionality 105 (for example functionality of a host device or peripheral device such as described above) and a user interface 106.

The NFC operational components include a demodulator 114 coupled between the antenna circuit 102 and the controller 107 for demodulating a modulated RF signal inductively coupled to the antenna circuit 102 from another near field RF communicator in near field range and for supplying the thus extracted data to the controller 107 for processing. The received signal is first past through a rectifier 200 and regulator 310. The regulator 310 sets the required pin voltage and rectifier 200 provides rectified voltage to remainder of NFC circuit. Together the rectifier 200 and regulator 310 protect the NFC operational components from high voltages received at antenna circuit 102. For example the regulator may limit the voltage to 3.3 volts. Any standard regulator and rectification circuit can be used for this. The NFC operational components may also include an amplifier for amplifying an RF signal inductively coupled to the antenna circuit 102.

In addition the NFC operational components include components for enabling modulation of an RF signal to enable data to be communicated to another near field RF communicator in near field range of the NFC communicator 100*a*. As shown in FIG. 2, these components comprise a signal generator 109 coupled via a driver 111 to the antenna circuit 102. In this example, the signal generator 110 causes modulation by gating or switching on and off the RF signal in accordance with the data to be communicated. The NFC communicator may use any appropriate modulation scheme that is in accordance with the standards and/or protocols under which the NFC communicator operates. As another possibility a separate or further signal controller may be incorporated within the NFC operational components to control modulation of the signal generated by the signal generator 109 in accordance with data or instructions received from the controller 107.

The NFC operational components also include a controller 107 for controlling overall operation of the NFC communicator. The controller 107 is coupled to a data store 108 for storing data (information and/or control data) to be transmitted from and/or data received by the NFC communications enabled device. The controller 107 may be a microprocessor, for example a RISC processor or other microprocessor or a state machine. Program instructions for programming the controller and/or control data for communication to another near field RF communicator may be stored in an internal memory of the controller and/or the data store.

The NFC communicator 100*a* may operate in an initiator mode (that is as an initiating near field RF communicator) or a target mode (that is as a responding near field RF communicator), dependent on the mode to which the NFC communicator is set. The mode may be determined by the controller 107 or may be determined in dependence on the nature of a received near field RF signal. When in initiator mode, an NFC communicator initiates communications with any compatible responding near field RF communicator capable of responding to the initiating NFC communicator (for example an NFC communicator in target mode or an RFID tag or transponder) that is in its near field range, while when in target mode an NFC communicator waits for a communication from a compatible initiating near field RF communicator (for example an NFC communicator in initiator mode or an RFID initiator or transceiver). As thus used, compatible means operable at the same frequency and in accordance with the same protocols, for example in accordance with the protocols set out in various standards such as ISO/IEC 18092, ISO/IEC 21481, ISO/IEC 14443 and ISO/IEC 15693. NFC communicators commonly operate at or around 13.56 MHz.

When in initiator or target mode, the NFC communicator may communicate in accordance with an active or passive protocol. When using an active protocol the initiating NFC communicator will transmit an RF field and following completion of its data communication turn off its RF field. The responding near field RF communicator (target) will then transmit its own RF field and data before again turning off the RF field and so on. When using a passive protocol the NFC communicator (initiator) will transmit and maintain its RE field throughout the entire communication sequence. The protocol used will depend on instructions received form the controller 107 and the response received from a responding near field RF communicator.

In FIG. 2 control of operation of the NFC communicator is through controller 107. In the alternative and where the NFC communicator is comprised as part of a host device, control of the operation of the NFC communicator may be directed by the host device, for example through other functionality 105. In such circumstances all or part of the control may be provided by other functionality 105. For example the NFC communicator controller 107 may control modulation and modulation protocols whereas the data to be transmitted may be provided by other functionality 105.

The NFC communicator also comprises an antenna circuit 102. The design of the antenna circuit will depend on the NFC communicator 100 and the environment in which it operates. For example the antenna circuit may be in the form described for co-pending international patent application number PCT/GB2008/000992 (which claims priority from GB 0705635.1).

An NFC communicator in accordance with the invention will also comprise a field power supply unit ("FPSU") 301. The FPSU 301 operates in parallel with the rectifier 200 and regulator 310 but unlike the rectifier 200 and regulator 310, the FPSU only operates where the NFC communicator needs to derive a power supply from the RF field supplied to antenna circuit 102 (for example, power provider 104 is not operational or has insufficient power available). Operation of the FPSU is via controller 107. The FPSU 301 will only operate when the received RF field strength is sufficient to derive a power supply, a sensor within the FPSU 301 detects when sufficient field strength is present. Output from the sensor is used by the controller 107 to turn on operation of the FPSU 301.

As will be described below, the FPSU operates when there is insufficient power from other sources (for example power provider 104) for the NFC communicator to operate and the received field strength is high enough for the FPSU to generate the required power. Usually the FPSU will provide power when the NFC communicator is in target mode and operating in accordance with a passive communications protocol. That means that the NFC communicator is receiving an H field from a corresponding near field RF communicator, for example an RFID transceiver or second NFC communicator. The FPSU 301 will supply power to the NFC communicator operational components or a restricted set of such operational components when the primary power supply (in this case a chargeable battery in the host device) is depleted or not present. The FPSU may also supply power to components within the host device where the NFC communicator is comprised within a host device, for example other functionality 105 as shown in FIG. 2.

Under strong field strength conditions, for example where the received field is in excess of 3 A/m the FPSU carries out rectification and sub-regulation to provide battery-less DC power supplies at the required voltage. The required voltage may vary, for example certain peripheral devices may require a different voltage from the main NFC functionality. In addition the FPSU may also provide a signal to the digital NFC functionality within the NFC communicator which triggers the NFC functionality to operate in 'low-power' mode. Such low-power mode may result in certain NFC functionality turning off, for example functionality which does not receive a power supply from the FPSU.

Figure 3:
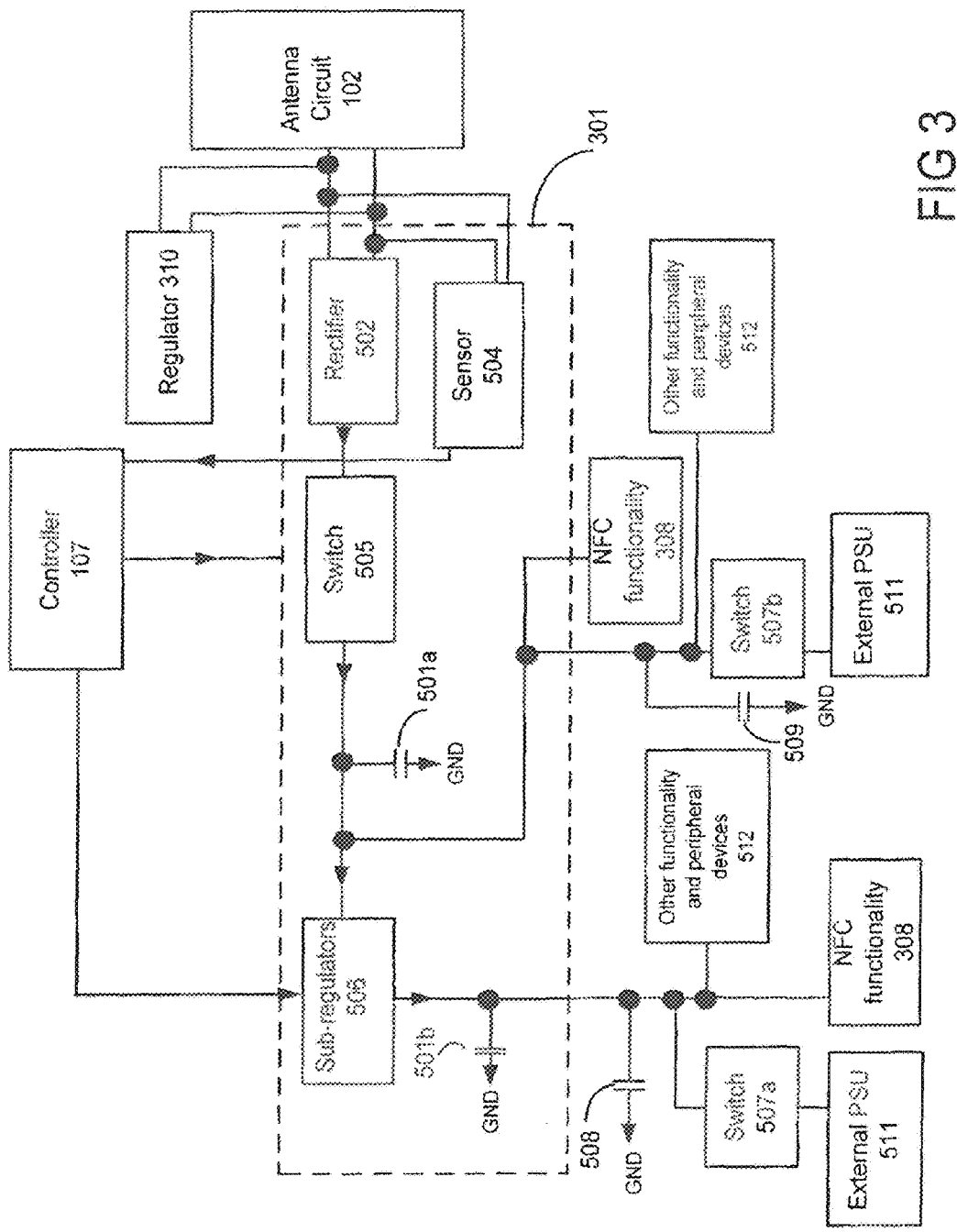
FIG. 3 shows an embodiment of a field power supply unit (FPSU) according to an aspect of the present invention.

FIG. 3 shows a functional block diagram to illustrate one example of a FPSU 301 and its connections to various components of an NFC communicator. In the interests of simplicity not all component or connections are shown.

The FPSU comprises a rectifier 502 and a sensor 504 both coupled in parallel with the antenna circuit 102 and regulator 310. An output of the rectifier 502 is coupled via switch 505 to capacitor 501a. The FPSU 301 has at least one output coupled to capacitor 501a. Another output is coupled to a second capacitor 501b which in turn is coupled, via sub-regulators 506, to capacitor 501a.

The controller 107 is arranged to control overall operation of the FPSU and FPSU sub regulators 506. The FPSU sensor 504 provides an input to controller 107.

The outputs of the FPSU are coupled to ground by capacitors 508 and 509 and to NFC functionality 308, other functionality and peripheral devices 512, and via switches 507a and 507b to external power supply unit 511. Dependent on their operational requirements, components of NFC functionality 308 (and other functionality and peripheral devices 512) may be coupled to draw power from the capacitor 501a. Other components of functionality 308' (and other functionality and peripheral devices 512') having different operational requirements may be coupled to draw sub regulated power from capacitor 501b.

The regulator 310 operates to protect components of the NFC communicator from over voltage conditions produced by high amplitude inductively coupled magnetic fields. The regulator operates by providing a shunt impedance to shunt current to ground to prevent an over voltage condition from developing.

The FPSU 301 operates when there is insufficient power from external power supply 511 (for example a battery power supply or power supply from a host device) and where the received magnetic field strength is high enough for the FPSU to generate the required power, that is when the sensor 504 detects sufficient signal strength being received via antenna circuit 102. A high enough received field may be, for example comparable to or in excess of 3 A/m. The FPSU is configured only to provide power to the NFC communicator and/or host device or peripheral devices where there is no power being supplied by any other power supply. Optionally other system power supplies not connected to the FPSU may still be operational.

When operating, the FPSU 301 extracts surplus shunted current from the received field that would normally be dissipated by the shunt regulator 302 and rectifies and sub-regulates the extracted signal.

Operation of sensor 504 is dependent on the status of the external power supply 511. When external power supply 511 is providing power above a threshold level, sensor 504 is prevented from providing a control signal to controller 107 and the FPSU remains switched off. Where sufficient signal strength is received a signal will be sent to the controller which will then control operation of the FPSU. When the external power supply 511 is depleted or unavailable sensor 504 monitors the amount of current being shunted by the regulator.

Sensor 504 may operate by detecting current shunted by regulator 310. In the event that sensor 504 senses that the regulator 310 is shunting more than a threshold amount of current (for example 10-20 mA), sensor 504 provides a control signal to controller 107 which switches on the FPSU in a controlled manner. As another possibility, sensor 504 may be configured to detect received signal strength directly.

When sensor 504 causes controller 107 to switch on the FPSU 301, switches 507 are opened (switched off) and switches 505 are closed (switched on). As will be described in more detail below, switch 505 (switches 505a and 505b in FIG. 4 to be described below)) should not be closed at the same time as switches 507 (507a and 507b). When switches 505 are closed, the output of the rectifier 502 charges the capacitor 501a.

Capacitors 501a and 501b each may be internal or external capacitors and may be, for example 200 pF capacitors. The size of the capacitors will be chosen depending on operational constraints and the power cycle demands of the NFC functionality 308 and other functionality and peripheral devices 512.

The charge stored in capacitors 501a, 501b, 508 and 509 may be used to provide power, for example to NFC functionality 308, other components external to the FPSU, or to external peripheral devices (510). Advantageously, capacitors 501a and 508 and 501b and 509 provide decoupling and power storage functions and may be provided as on-chip or off-chip, for example as integrated capacitances or as discrete and/or external capacitors.

In an example, capacitors 501a and 501b each may be internal (on-chip) and may be, for example 200 pF (pico-Farad) capacitors whilst capacitors 508 and 509 may be external (off-chip) and may be for example 15 .mu.F capacitors. The size of the capacitors will be chosen depending on operational constraints and the power cycle demands of the NFC functionality 308 and other functionality and peripheral devices 512.

Components of the NFC functionality 308 and other functionality and peripheral devices 512' may have temporally varying power requirements, for example cyclic or switched power requirements. If the current drawn from the FPSU outputs varies this may modify the voltage at its inputs and hence the loading of the antenna circuit. These variations may modulate the apparent received signal and thus mask or modify received modulation or transmitted load modulation. This is a particular problem for example where the NFC communicator is communicating with low modulation index protocols such as with ISO/IEC 14443 type-B reader (described in more detail in international standard ISO/IEC14443B).

To alleviate this problem, components that may have temporally varying power requirements, for example cyclic or switched power requirements and so may provide temporally varying loads, may be coupled to capacitors 501b and 508 rather than 501a and 509 to enable, the sub-regulators to provide internal damping and smoothing of the load by restricting and shunting away any fluctuations in the load. The structure and operation of an example of a sub regulator will be described in more detail below with reference to FIG. 6.

As described above operation of the FPSU is controlled depending on the level of an external power supply 104 and the level of an inductively coupled magnetic field signal. These levels are measured by sensors, for example sensor 504, and compared with certain thresholds. Additional sensors (not shown) may also be included or sensing may be performed by sensor 504. The thresholds may be chosen at the time an NFC device is designed. If chosen at design time these thresholds may be hard-wired (incorporated into the design). As another possibility these thresholds may be programmable or controllable, for example by a host device containing an NFC communicator. The thresholds may be set at any appropriate level and are designed to exhibit some hysteresis to provide operational stability.

Where the NFC communicator is a component of a host device the FPSU may also supply power to components within that host device, for example to other functionality 105 (FIG. 2).

NFC functionality 308 and other functionality and peripheral devices 512 may require different voltages, for example certain peripheral devices may require a different voltage from the main NFC functionality. Accordingly, to conserve power the FPSU may provide a signal to the NFC communicator which triggers operation in a 'low-power' mode. A low-power mode may result in certain functionality turning off.

An example of the rectifier 502 is described in more detail below with reference to FIGS. 4 and 5. The rectifier is used by the FPSU (301 in FIGS. 2 and 3) to convert the received field into a rectified DC supply, for example a rectified +3V supply.

Figure 4:
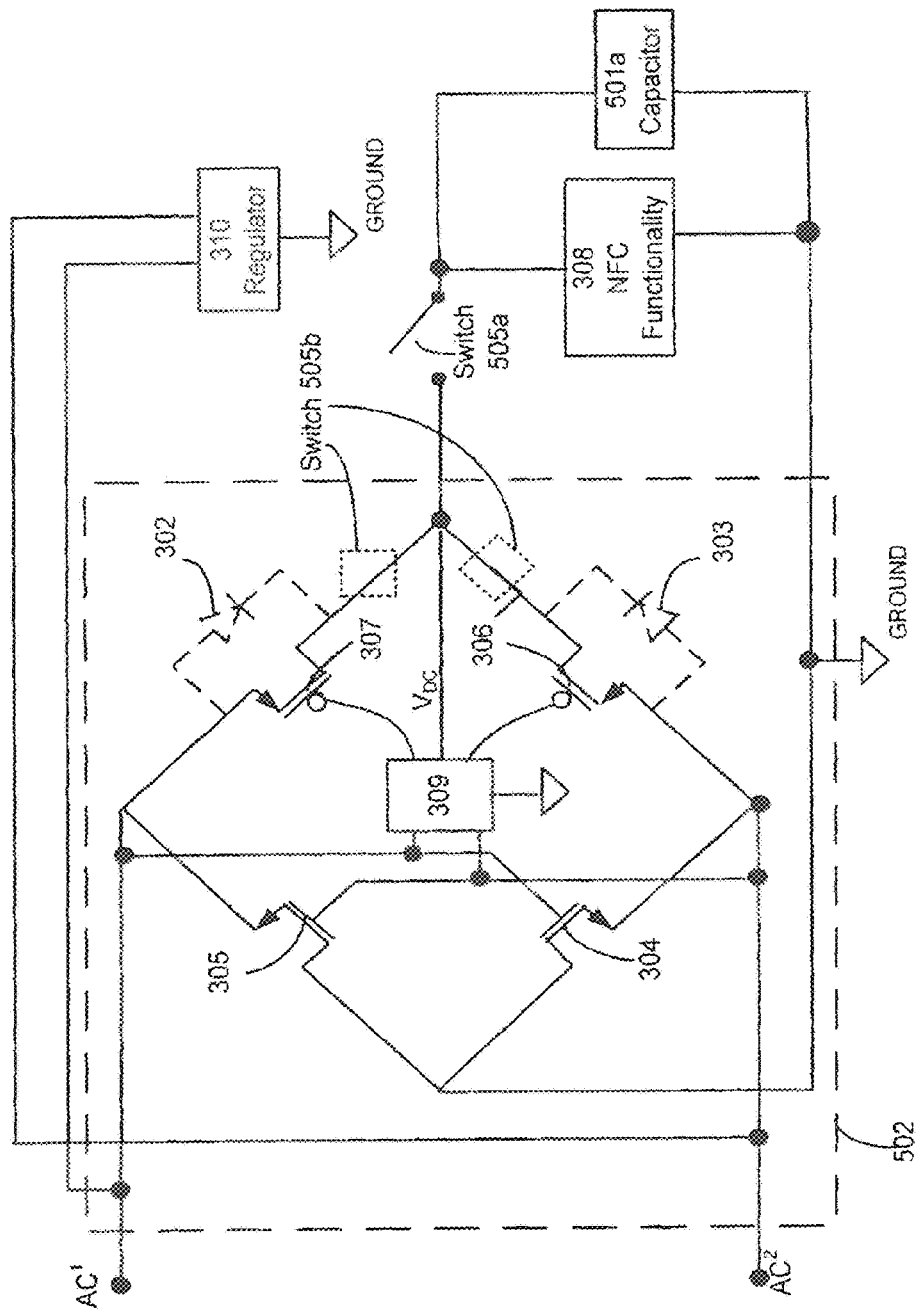
FIG. 4 shows an embodiment of a rectifier suitable for use in an FPSU according to an aspect of the present invention.

The rectifier 502 shown in FIG. 4 has two voltage inputs $AC^1$ and $AC^2$ which may be taken directly from the antenna circuit of the NFC communicator. The antenna circuit is designed to couple to a varying magnetic field to provide an AC voltage across terminals $AC^1$, $AC^2$, Coupled between terminals $AC^1$, $AC^2$ is a four armed bridge which comprises forward gate controlled switches 306 and 307 and ground return path gate controlled switches 304 and 305. The gate of each switch controls a conduction path via a conduction channel of the switch. The conduction channel of switch 307 provides a conduction path to connect AC terminal $AC^1$ with rectifier output $V_{DC}$ via switch 505b. The conduction channel of 306 provides a conduction path to connect AC terminal $AC^2$ with rectifier output $V_{DC}$ via switch 505b. Optionally the rectifier 301 may comprise diodes 302 and 303 (shown in dotted lines) in parallel with switches 306 and 307. The conduction channel of gate controlled switch 304 couples $AC^2$ to ground and the gate terminal of 304 is coupled to $AC^1$. The conduction channel of switch 305 couples $AC^1$ to ground and the gate terminal of 305 is coupled to $AC^2$.

The gate terminals of gate controlled switches 306 and 307 are coupled to and controlled by a comparator 309. Comparator 309 is coupled to $AC^1$ and $AC^2$, and to the gate terminals of gate controlled switches 306 and 307 and to the rectifier output $V_{DC}$.

Coupled between rectifier output $V_{DC}$ and ground via switch 505a is NFC functionality 308 in parallel with capacitor 501a. Regulator 310 is coupled to AC terminals $AC^1$ and $AC^2$ to regulate the voltage provided via the rectifier 301 to at least some components of the NFC functionality 308.

Rectifier 301 acts to rectify an AC signal $AC^1$, $AC^2$, to provide a DC voltage at rectifier output $V_{DC}$. The rectified signal is used to provide a voltage to NFC functionality 308.

When $AC^1$ is high 304 is conducting and $AC^2$ is clamped to ground and when $AC^2$ is high 305 is conducting so $AC^1$ is clamped to ground.

Comparator 309 separately compares signals $AC^1$ and $AC^2$ with $V_{DC}$ and acts to render 306 conducting in the event that $AC^2$ is greater than $V_{DC}$ and to render 307 conducting in the event that $AC^1$ is greater than $V_{DC}$. This has the effect of selecting whichever of $AC^1$ and $AC^2$ is greater than $V_{DC}$ and of disconnecting the rectifier 301 from $V_{DC}$ where neither $AC^1$ nor $AC^2$ is greater than $V_{DC}$. In other words, 306 and 307 only ever provide forward conducting paths so there can be no current flow from $V_{DC}$ to either $AC^1$ or $AC^2$.

The output of comparator 309 may not provide sufficient voltage to meet the gate threshold of switches 306 and 307. In these circumstances diodes 302 and 303 enable the rectifier to act in a passive mode without the need for active switching of 306 and 307. Components of the NFC functionality 308 or regulator 310, or other components provide capacitive storage. This enables rectifier 301 to store energy when operating in a passive mode by charging this capacitive storage. Once sufficient energy has been stored the rectifier is able to begin operating in a more efficient active switching mode.

The nature of the devices used 306, 307, 302, 303, 304, 305 will depend on the design and process constraints. In this example switches 304 and 305 are enhancement mode NMOS transistors and 306 and 307 are enhancement mode bulk switched PMOS type transistors. Diodes 302 and 303 may be diode-coupled MOS transistors or they may be inherent well or body diodes formed between the back gate and the source electrode of MOS transistors.

Switch 505 and 507 may be provided by a bulk switching scheme thereby enabling simultaneous control of all required switches. In FIG. 3 switches 507a and 507b are shown separately. Switches 507a and 507b are arranged to open and close in anti-phase with switch 505. In other words, applying a bias which closes switches 507a and 507b opens switches 505a and 505b. Likewise, applying a bias which closes switches 505a and 505b opens switches 507a and 507b. This means that the NFC functionality may be powered either by the FPSU, or by the external PSU, but not by both. This switching scheme ensures that the FPSU and the external power supplies are never directly connected to each other.

Switches 507a and 507h are arranged so that when the power supplied by external PSU falls below a certain level, switches 507a and 507b are off.

Forming components 306, 307, 302, 303, 304, 305, 309 of the rectifier from CMOS transistors enables an entire chip to be manufactured by a standard process and no additional semiconductor manufacturing step is necessary such as might be required by the use of Schottky diodes. This avoids the requirement for complex manufacturing processes and reduces the costs associated with manufacture.

Passive rectifiers dissipate power because of diode forward-bias voltage (diode drop). Active switching of forward switches 306 and 307, driven by comparator 309 limits losses in the rectifier and enables substantially most of the derived power to be provided to the NFC functionality 308 and the regulator 310. In some examples the rectifier will provide a DC voltage only 100 mV less than the peak voltage provided by an inductively coupled AC voltage $AC^1$, $AC^2$.

The above described features provide a rectifier having improved adaptability, efficiency and simplicity of manufacture As described above the rectifier 502 is connected to regulator 310, capacitor 501 and NFC functionality 308. NFC functionality 308 may, for example correspond to NFC functionality 114, 107, 108, 109, 111 in FIG. 2. NFC functionality 308 requires a minimum voltage to operate, for example 1.5V. Rectifying a greater portion of the inductively coupled signal decreases the minimum level of coupled signal at which the NFC functionality may operate. This in turn increases the operating distance range of an NFC communicator.

As described above, operation of switches 306 and 307 is controlled via comparator 309. The comparator 309 compares the inductively coupled signal (at $AC^1$ and $AC^2$) with $V_{DC}$.

Comparator 309 has at least two sections, each section comprising two input terminals, one coupled to $V_{DC}$ and one coupled to at most one of $AC^1$ and $AC^2$, and one output terminal 408 coupled, via amplifier stages 407, to at most one of the switches 306 and 307. The structure of one of these sections of comparator 309 is described below with reference to FIG. 5.

Coupled to the first input terminal, $V_{DC}$, are the source terminals of PMOS transistors 401 and 402. The gate terminals of 401 and 402 are connected to each other and to the drain terminal of 401. The drain terminal of 401 is coupled, via a load (not shown) to ground. The drain terminal of 402 is connected to output terminal 408 and to the drain terminal of NMOS transistor 403. The gate terminal of 403 is coupled to the gate and drain terminals of NMOS transistor 404, and to the drain terminal of a third PMOS transistor 409. The source terminals of 403 and 404 are both coupled to ground.

The gate terminal of 409 is coupled to the gate terminals of 401 and 402. The source terminal of 409 is coupled to an AC comparator input terminal, which in the example of FIG. 4 is $AC^1$.

The comparator compares an AC source current with a current produced by $V_{DC}$ and provides an output to the gate terminal of switch 306 or 307 (307 in the comparator section shown in FIG. 5) which is dependent on this comparison.

At any time the comparator output may bias the gate of either 306 or 307, but not both, to provide a conduction path between one terminal of the AC source and $V_{DC}$. If neither $AC^1$ nor $AC^2$ is higher than $V_{DC}$, the comparator will not bias either 306 or 307 to provide a conduction path between the AC source and $V_{DC}$.

In some examples multiple rectifiers may be used and, optionally, switches 306 and 307 may each be multiple parallel switches.

As described above, the comparator 309 has at least two sections. The function of one of those sections will now be described in more detail with reference to FIG. 5.

The current through PMOS transistor 409, which is representative of an AC source current, is compared with the $V_{DC}$ current through the series of mirrored PMOS transistors 401 and 402 and NMOS transistors 403 and 404.

When the current through transistor 403 is higher than the current through transistors 401 and 402, a current source verses current sink difference will be generated between PMOS transistor 402 and NMOS transistor 403 resulting in a voltage decrease at node 408.

When the current through transistor 403 is lower than the current through transistor 401 and 402, a current source verses current sink difference will be generated between PMOS transistor 402 and NMOS transistor 403, but this time in the opposite orientation. The voltage at node 408 will therefore increase.

The difference between the two input currents is provided from the junction 408 to the amplifier stage 407. The output of the amplifier stage 407 is coupled to the gate of gate controlled switch 307 to connect $AC^1$ to $V_{DC}$ in the event that $AC^1$ is greater than $V_{DC}$.

Figure 5:
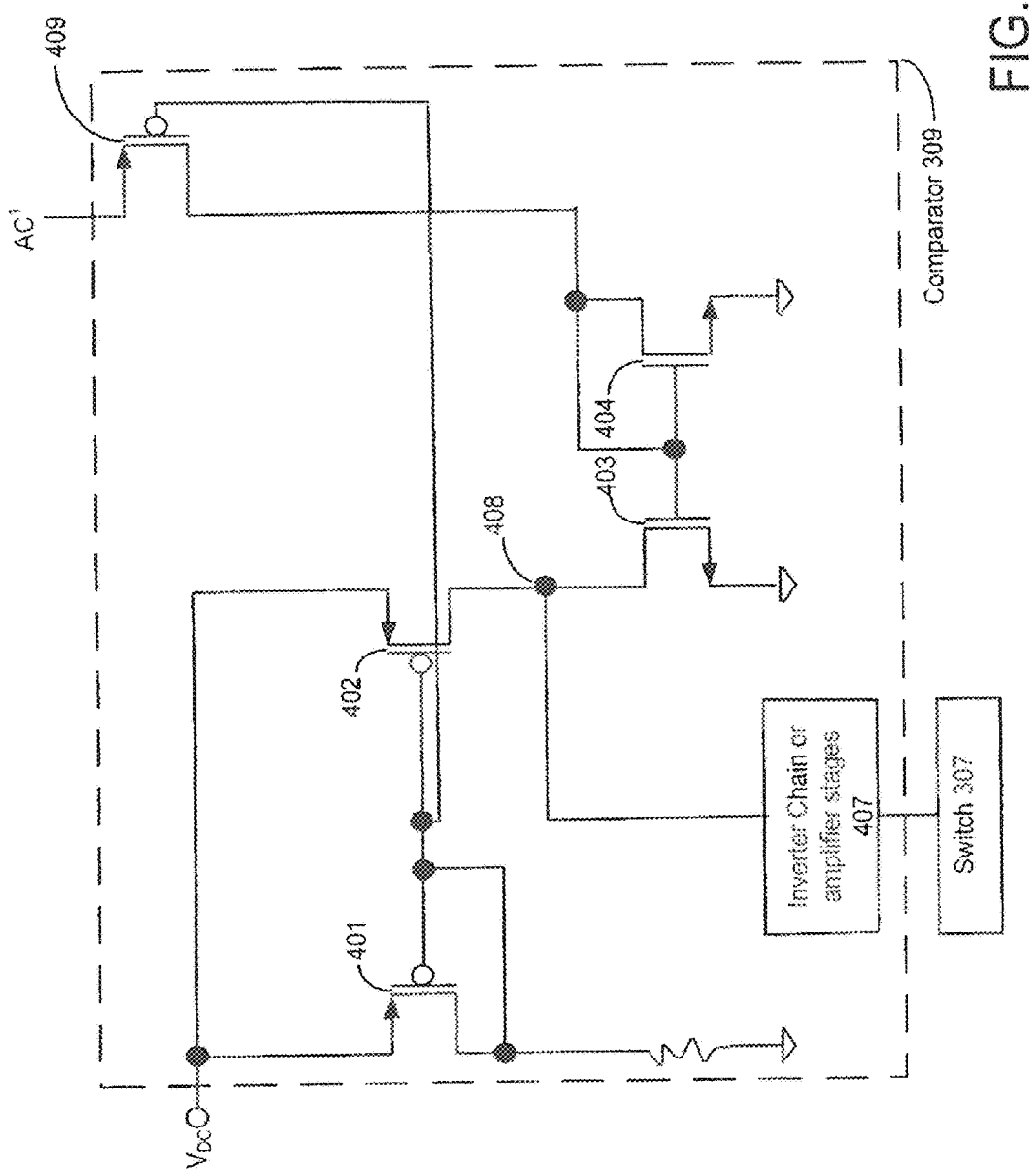
FIG. 5 shows a diagram to illustrate an embodiment of a comparator suitable for use within the rectifier shown in FIG. 4.

Only one AC source input $AC^1$ is shown in FIG. 5 but transistors 403, 404 and 409 and amplifier stage 407 are replicated for both AC source inputs ($AC^1$ and $AC^2$ as shown in FIG. 4) for their respective switch transistor outputs (306 for $AC^2$ and 307 for $AC^1$).

One amplifier stage 407 and switch control output 307 is shown in FIG. 5 but there may be multiple such outputs.

Advantageously the use of current based comparator 309 provides power and efficiency gains over voltage comparators because: there is no need to provide a bandgap reference or to provide significant power to op-amps which may have supply and input range limitations; and, a current mirror based comparator can inherently adapt to field power levels and will draw less power in low fields. Further advantageously this comparator consists of CMOS transistors and can be manufactured as part of the same process as the rest of rectifier 301 by a standard process and no additional semiconductor manufacture steps are required.

The threshold levels of the components of the circuit can be chosen to adjust the operating parameters of the circuit, for example to adjust the sensitivity of the circuit to differences between $V_{DC}$ and the AC source, or to adjust the $V_{DC}$ level provided by the circuit or required to operate the circuit. This enables the circuit to be very flexible to changes in field strength and maximises operating range by allowing the maintenance of good operating voltages in significantly lower fields than might otherwise be possible.

Amplifier stages 407 can be used to amplify the change in voltage at node 408 and may be realised by a chain of inverters.

An example sub-regulator 506 will now be described with reference to FIG. 6.

In the example a sub regulator is shown having four terminals, a voltage reference input terminal V1, a power coupling terminal VDD, an output OUTPUT and a coupling to ground.

Figure 6:
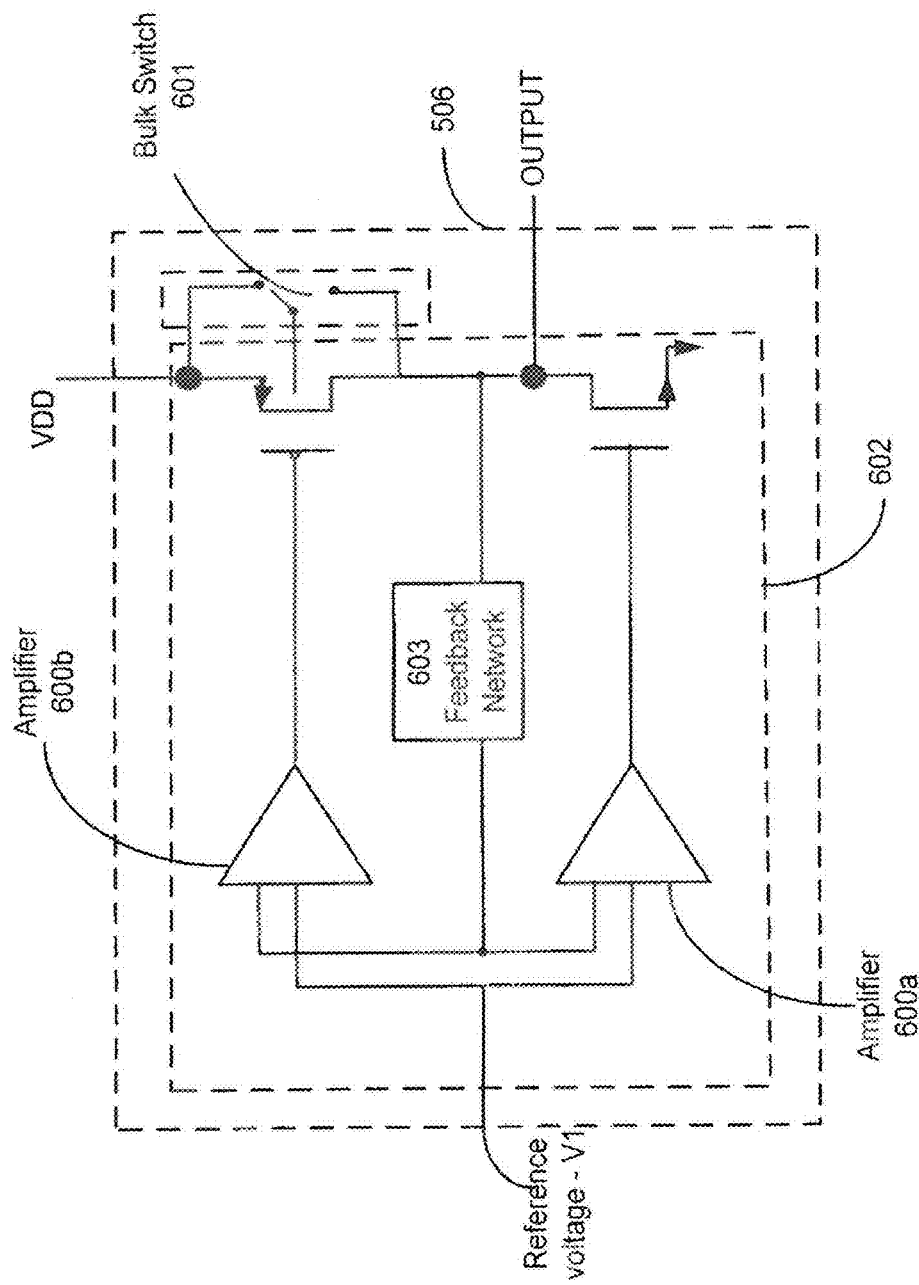
FIG. 6 shows an embodiment of a sub-regulator suitable for use in a FPSU according to an aspect of the present invention.

As shown in FIG. 6, two amplifiers 600a and 600b, a feedback network 603, a PMOS transistor 604 and an NMOS transistor 605 are arranged as a class A-B amplifier stage 602, One input of each amplifier 600a, 600b, is coupled to the reference voltage V1 and the other input of each amplifier 600a, 600b, is coupled to a feedback network 603.

The source electrode of bulk switched PMOS transistor 604 is connected to VDD. The drain electrode of 604 is coupled to the drain electrode of NMOS transistor 605, and the source electrode of 605 is coupled to ground. The drain electrodes of 604 and 605 are both coupled to the output and to feedback network 603.

Bulk switch 601 on PMOS transistor 604 is configured to allow the back gate of 604 to be switched between being connected to either the source or drain electrodes of 604.

The sub-regulator 506 presents a constant load characteristic to VDD and acts to provide a constant voltage output. This stabilises the demands placed on the field power supply to avoid inadvertent load modulation of the apparent received field.

In effect the sub-regulator 506 of FIG. 6 is a series low-drop-out regulator followed by a shunt regulator. Realising these two component parts of the sub regulator in a single unit (using, in this case, class-AB architecture) means there is no requirement to design and test them as separate units. In other words there is no requirement to design and test a separate series low drop out regulator and a separate shunt regulator and then to combine (and test) the two together. Rather the sub regulator of the present invention is realised as a single unit and may be designed and tested as such. This takes advantage of known processes to provide improved efficiency and reduced manufacturing and development costs.

Bulk switch 601 couples the bulk of PMOS transistor 604 to the higher of the source and drain voltages. In other words, the (n-type) bulk of transistor 604 is coupled to the highest available voltage. This acts to prevent transistor 604 from coupling VDD or output to a ground path.

The sub-regulated output voltage, OUTPUT, will be set by input reference level V1 and feedback network 603 according to the required output voltage for example 1.2 or 1.8V. The sub-regulators may regulate voltage to for example 1.2V or 1.1V, depending on the end voltage required. As another example a single wire protocol peripheral device requires a 1.8V power supply.

The reference voltage may be, for example, a bandgap reference. The feedback network 603 may, for example, comprise a resistive network.

The sub-regulators described above down-regulate voltage and shunt away excess current to control fluctuations in the delivered load—hence representing a DC load characteristic to the field power supply so as not to disturb the communication of data over the field.

The rectifiers and sub-regulators described above should preferably employ bulk switching (PMOS) devices to ensure a safe power supply strategy thus ensuring both the rectified and regulator output supplies can be safely driven by external power supply.

Although as described above, diodes 302 and 303 may be diode coupled MOS transistors or they may be inherent well or body diodes formed between the back gate and the source electrode of MOS transistors, the diodes 302 and 303 could also be Schottky diodes.

Although as described above, there are plural sub regulators it is possible that there may be circumstances where only one is required.

The sensor described above may compare a reference current (for example derived from a bandgap reference) with the current shunted by regulator 310. Once current reaches a pre-determined threshold, for example 5 mA, then switch 505 is closed and output from rectifier 502 directed to capacitor 501a. Current can be compared directly or the current may preferably first be scaled down to more manageable levels. A scaled copy of the current shunted by regulator 310 may also be used.

Sensor 504 is shown as a separate unit within the FPSU. The sensor may be comprised within rectifier 502. As another possibility, the sensor 504 may be situated elsewhere within the NFC communicator, for example within regulator 310 or rectifier 200 (see FIG. 2).

One series of rectifiers/capacitors and sub-regulators is shown within FPSU 301 in FIG. 3. There may be multiple series of rectifiers and sub-regulators depending on the voltages required and end power requirements.

CONCLUSION

In the above embodiments the invention is described in connection with an NFC communicator. It will be apparent to the skilled man that the same system could be used in any near field RF communicator where power derivation from a received RF field is required and where a variable power supply is required i.e. more than simply a power supply as used by a passive transponder.

The above embodiments are to be understood as illustrative examples of the invention. Further embodiments of the invention are envisaged. It is to be understood that any feature described in relation to any one embodiment may be used alone, or in combination with other features described, and may also be used in combination with one or more features of any other of the embodiments, or any combination of any other of the embodiments. Furthermore, equivalents and modifications not described above may also be employed without departing from the scope of the invention, which is defined in the accompanying claims. It will be apparent to those skilled in the relevant art(s) that various changes in form and detail can be made therein without departing from the spirit and scope of the disclosure. Thus the present disclosure should not be limited by any of the above-described exemplary embodiments, but should be defined only in accordance with the following claims and their equivalents.

What is claimed is:

1. A communication device, comprising:
    a first power supply unit configured to derive a first power supply from a magnetic field, the first power supply unit comprising:
        a first switch configured to couple the first power supply to near field communication (NFC) functionality or to decouple the first power supply from the NFC functionality; and
    a second switch configured to couple a second power supply to the NFC functionality or to decouple the second power supply from the NFC functionality,
    wherein the first switch and the second switch are further configured to operate in a complementary manner such that the first switch and the second switch are not configured to couple the first power supply and the second power supply, respectively, to the NFC functionality at the same time.

2. The communication device of claim 1, further comprising:
    a controller configured to cause the first switch to couple the first power supply to the NFC functionality and to cause the second switch to decouple the second power supply from the NFC functionality when the second power supply is insufficient to power the NFC functionality.

3. The communication device of claim 1, further comprising:
a controller configured to cause the first switch to couple the first power supply to the NFC functionality and to cause the second switch to decouple the second power supply from the NFC functionality when an intensity of the magnetic field is high enough for the first power supply to generate sufficient power for the NFC functionality.

4. The communication device of claim 1, wherein the second power supply comprises:
a battery power supply; or
a power supply from a host device.

5. The communication device of claim L wherein the NFC functionality comprises at least one of:
a demodulator;
a signal generator;
a driver, or
a data store.

6. The communication device of claim 1, wherein the first switch is further configured to couple the first power supply to other functionality and peripheral devices or to decouple the first power supply from the other functionality and peripheral devices, and
wherein the second switch is further configured to couple the second power supply to the other functionality and peripheral devices or to decouple the second power supply from the other functionality and peripheral devices.

7. The communication device of claim 6, wherein the other functionality and peripheral devices comprise at least one of:
a subscriber identity module (SIM) card,
a Secure Element;
a memory device; or
a display driver.

8. The communication device of claim 1, wherein the first power supply comprises:
a rectifier configured to supply a rectified voltage derived from a communication signal inductively received by an antenna circuit from the magnetic field;
a charge storing element configured to store the rectified voltage; and
a regulator configured to regulate the rectified voltage.

9. A communication device, comprising:
a first power supply unit, including a first switch, configured to derive a first power supply from a magnetic field; and
a controller configured to cause the first switch to couple the first power supply to near field communication (NFC) functionality and to cause a second switch to decouple a second power supply from the NFC functionality,
wherein the first switch and the second switch are further configured to operate in a complementary manner such that the first switch and the second switch are not configured to couple the first power supply and the second power supply, respectively, to the NFC functionality at the same time.

10. The communication device of claim 9, wherein the controller is configured to cause the first switch to couple the first power supply to the NFC functionality and to cause the second switch to decouple the second power supply from the NFC functionality when the second power supply is insufficient to power the NFC functionality.

11. The communication device of claim 9, wherein the controller is configured to cause the first switch to couple the first power supply to the NFC functionality and to cause the second switch to decouple the second power supply from the NFC functionality when an intensity of the magnetic field is high enough for the first power supply to generate sufficient power for the NFC functionality.

12. The communication device of claim 9, wherein the second power supply comprises:
a battery power supply; or
a power supply from a host device.

13. The communication device of claim 9, wherein the NFC functionality comprises at least one of:
a demodulator;
a signal generator;
a driver, or
a data store.

14. The communication device of claim 9, wherein the first switch is further configured to couple the first power supply to other functionality and peripheral devices or to decouple the first power supply from the other functionality and peripheral devices, and
wherein the second switch is further configured to couple the second power supply to the other functionality and peripheral devices or to decouple the second power supply from the other functionality and peripheral devices.

15. The communication device of claim 14, wherein the other functionality and peripheral devices comprise at least one of:
a subscriber identity module (SIM) card,
a Secure Element;
a memory device; or
a display driver.

16. A communication device, comprising:
a first power supply unit configured to derive a first power supply from a magnetic field, the first power supply unit comprising:
a first switch configured to couple the first power supply to other functionality and peripheral devices or to decouple the first power supply from the other functionality and peripheral devices; and
a second switch configured to couple a second power supply to the other functionality and peripheral devices or to decouple the second power supply from the other functionality and peripheral devices,
wherein the first switch and the second switch are further configured to operate in a complementary manner such that the first switch and the second switch are not configured to couple the first power supply and the second power supply, respectively, to the other functionality and peripheral devices at the same time.

17. The communication device of claim 16, further comprising:
a controller configured to cause the first switch to couple the first power supply to the other functionality and peripheral devices and to cause the second switch to decouple the second power supply from the other functionality and peripheral devices when the second power supply is insufficient to power the other functionality and peripheral devices.

18. The communication device of claim 16, further comprising:
a controller configured to cause the first switch to couple the first power supply to the NFC functionality and to cause the second switch to decouple the second power supply from the other functionality and peripheral devices when an intensity of the magnetic field is high enough for the first power supply to generate sufficient power for the other functionality and peripheral devices.

19. The communication device of claim 16, wherein the other functionality and peripheral devices comprise at least one of:
- a subscriber identity module (SIM) card;
- a Secure Element;
- a memory device; or
- a display driver.

20. The communication device of claim 16, wherein the second power supply comprises:
- a battery power supply; or
- a power supply from a host device.

* * * * *